United States Patent
Kim et al.

(10) Patent No.: US 9,299,836 B2
(45) Date of Patent: Mar. 29, 2016

(54) SEMICONDUCTOR DEVICES INCLUDING MULTILAYER SOURCE/DRAIN STRESSORS AND METHODS OF MANUFACTURING THE SAME

(71) Applicant: Samsung Electronics Co., Ltd., Suwon-si (KR)

(72) Inventors: Dong Hyuk Kim, Seongnam-si (KR); Hoi Sung Chung, Hwaseong-si (KR); Dongsuk Shin, Yongin-si (KR); Naein Lee, Seoul (KR)

(73) Assignee: Samsung Electronics Co, Ltd. (KR)

( * ) Notice: Subject to any disclaimer, the term of this patent is extended or adjusted under 35 U.S.C. 154(b) by 0 days.

(21) Appl. No.: 14/626,211

(22) Filed: Feb. 19, 2015

(65) Prior Publication Data

US 2015/0179795 A1 Jun. 25, 2015

Related U.S. Application Data

(63) Continuation of application No. 13/949,303, filed on Jul. 24, 2013, now abandoned.

(30) Foreign Application Priority Data

Sep. 24, 2012 (KR) .................. 10-2012-0105825

(51) Int. Cl.
*H01L 29/66* (2006.01)
*H01L 29/78* (2006.01)
(Continued)

(52) U.S. Cl.
CPC .......... *H01L 29/7833* (2013.01); *H01L 29/045* (2013.01); *H01L 29/0847* (2013.01); *H01L 29/165* (2013.01); *H01L 29/66477* (2013.01); *H01L 29/66636* (2013.01); *H01L 29/7834* (2013.01); *H01L 29/7848* (2013.01)

(58) Field of Classification Search
CPC ..................... H01L 29/66477; H01L 29/7833; H01L 29/7848; H01L 29/66636; H01L 29/7834; H01L 29/0847; H01L 29/165; H01L 29/045
See application file for complete search history.

(56) References Cited

U.S. PATENT DOCUMENTS

2006/0234504 A1* 10/2006 Bauer ..................... C23C 16/04
 438/674
2008/0023773 A1* 1/2008 Shimamune .......... H01L 29/165
 257/377

(Continued)

FOREIGN PATENT DOCUMENTS

| JP | 2009-088021 | 4/2009 |
|---|---|---|
| JP | 2011-165859 | 8/2011 |
| KR | 1020080098894 A | 11/2008 |

*Primary Examiner* — Minh-Loan Tran
*Assistant Examiner* — Farid Khan
(74) *Attorney, Agent, or Firm* — Myers Bigel & Sibley, P.A.

(57) ABSTRACT

A semiconductor device including source drain stressors and methods of manufacturing the same are provided. The methods may include forming a recess region in the substrate at a side of a gate pattern, and an inner surface of the recess region may include a first surface of a (100) crystal plane and a second surface of one of {111} crystal planes. The method may further include performing a first selective epitaxial growth (SEG) process to form a base epitaxial pattern on the inner surface of the recess region at a process pressure in a range of about 50 Torr to about 300 Torr. The method may also include performing a second selective epitaxial growth (SEG) process to form a bulk epitaxial pattern on the base epitaxial pattern.

8 Claims, 13 Drawing Sheets

(51) Int. Cl.
*H01L 29/08* (2006.01)
*H01L 29/165* (2006.01)
*H01L 29/04* (2006.01)

(56) References Cited

U.S. PATENT DOCUMENTS

| | | |
|---|---|---|
| 2008/0135894 A1 | 6/2008 | Bohr et al. |
| 2008/0283906 A1 | 11/2008 | Bohr |
| 2009/0134381 A1 | 5/2009 | Shimamune et al. |
| 2010/0078689 A1 | 4/2010 | Kronholz et al. |
| 2010/0311218 A1 | 12/2010 | Fukutome et al. |
| 2011/0001170 A1 | 1/2011 | Ito et al. |
| 2011/0117732 A1* | 5/2011 | Bauer ............... H01L 21/02381 438/507 |
| 2011/0147828 A1* | 6/2011 | Murthy ............. H01L 21/02057 257/327 |
| 2011/0287611 A1 | 11/2011 | Cheng et al. |
| 2012/0001254 A1 | 1/2012 | Kronholz et al. |
| 2012/0061736 A1 | 3/2012 | Yin et al. |
| 2012/0074468 A1 | 3/2012 | Yeh et al. |
| 2012/0088342 A1 | 4/2012 | Ming et al. |
| 2012/0256264 A1* | 10/2012 | Haneda ........... H01L 21/823807 257/368 |
| 2013/0105861 A1* | 5/2013 | Liao .................... H01L 29/7848 257/192 |
| 2013/0109144 A1* | 5/2013 | Kim .................. H01L 21/02532 438/301 |
| 2013/0210207 A1* | 8/2013 | Fukuda ............. H01L 21/76232 438/285 |
| 2013/0256664 A1* | 10/2013 | Qin ................. H01L 21/823807 257/57 |

* cited by examiner

SEMICONDUCTOR DEVICES INCLUDING MULTILAYER SOURCE/DRAIN STRESSORS AND METHODS OF MANUFACTURING THE SAME

CROSS-REFERENCE TO RELATED APPLICATIONS

This application is a continuation of U.S. patent application Ser. No. 13/949,303, filed Jul. 24, 2013, which claims priority under 35 U.S.C. §119 to Korean Patent Application No. 10-2012-0105825 filed on Sep. 24, 2012, in the Korean Intellectual Property Office. The disclosures of the above referenced applications are hereby incorporated by reference herein in their entireties.

FIELD

The present disclosure generally relates to the field of electronics, and more particularly semiconductor devices.

BACKGROUND

Semiconductor devices are widely used in various industries such as electronic devices, cars and/or vehicles because of their small size, lightness, and low manufacture costs. An electric field transistor (hereinafter, referred to as a transistor) may be one of important components constituting semiconductor devices. Generally, a transistor may include a source, a drain, and a gate electrode. The source and the drain may be spaced apart from each other in a semiconductor substrate, and the gate electrode may be disposed over a channel region between the drain and the source. The source and the drain may be formed by implanting dopant ions into the semiconductor substrate. The gate electrode may be electrically insulated from the channel region by a gate oxide layer therebetween.

The transistors may be widely used as a switching component and/or components constituting a logic circuit in the semiconductor device. Recently, high speed transistors have been increasingly demanded. On the contrary, sizes of the transistors have been more reduced with high integration of semiconductor devices. Thus, a turn-on current of a transistor may be reduced and performance of the transistor may deteriorate, such that reliability of a semiconductor device may deteriorate. Additionally, an operating speed of the semiconductor device may be reduced. Therefore, various researches have been conducted for increasing the turn-on current of the transistor.

Source drain stressors may be used to increase the carrier mobility in the channel region of the MOS transistor. Tensile stressors may be used for an NMOS transistor and compressive stressors may be used for a PMOS transistor. Stressor materials may be epitaxial layers.

SUMMARY

A semiconductor device may include a substrate including a first semiconductor element and a gate pattern on the substrate. The device may further include a base epitaxial pattern on an inner surface of a recess region in the substrate at a side of the gate pattern. The inner surface of the recess region may include a first surface of a (100) crystal plane and a second surface of one of {111} crystal planes. The base epitaxial pattern may include a second semiconductor element different from the first semiconductor element. The device may also include a bulk epitaxial pattern on the base epitaxial pattern and the bulk epitaxial pattern may include the second semiconductor element. The base epitaxial pattern may have a first thickness on the first surface and a second thickness on the second surface, and a ratio of the second thickness to the first thickness of the base epitaxial pattern may be in a range of about ¾ to about 1.

In various embodiments, a second semiconductor element concentration in the base epitaxial pattern may be less than a second semiconductor element concentration in the bulk epitaxial pattern.

According to various embodiments, the substrate may include first dopants of a first conductivity type and the bulk epitaxial pattern may include second dopants of a second conductivity type different from the first conductivity type. A second dopant concentration in the base epitaxial pattern may be less than a second dopant concentration in the bulk epitaxial pattern.

In various embodiments, the base epitaxial pattern may be free of the second dopants According to various embodiments, the base epitaxial pattern may be formed at a process pressure in a range of about 50 Torr to about 300 Torr.

In various embodiments, the recess region may include an undercut region tapered toward a region under the gate pattern.

According to various embodiments, the semiconductor device may additionally include a buffer epitaxial pattern between the base epitaxial pattern and the bulk epitaxial pattern. The buffer epitaxial pattern may include the second semiconductor element, and a second semiconductor element concentration in the buffer epitaxial pattern may be less than a second semiconductor element concentration in the bulk epitaxial pattern and may be greater than a second semiconductor element concentration in the base epitaxial pattern.

According to various embodiments, the buffer epitaxial pattern may have a third thickness on the first surface and a fourth thickness on the second surface and a ratio of the fourth thickness to the third thickness of the buffer epitaxial pattern may be less than the ratio of the second thickness to the first thickness of the base epitaxial pattern.

In various embodiments, the substrate may include first dopants of a first conductivity type, the bulk epitaxial pattern and the buffer epitaxial pattern may include second dopants of a second conductivity type different from the first conductivity type. A second dopant concentration in the buffer epitaxial pattern may be less than a second dopant concentration in the bulk epitaxial pattern, and the base epitaxial pattern may be free of the second dopants or a second dopant concentration in the base epitaxial pattern may be less than the second dopant concentration in the buffer epitaxial pattern.

A method of manufacturing a semiconductor device may include forming a gate pattern on a substrate including a first semiconductor element and forming a recess region in the substrate at a side of the gate pattern. An inner surface of the recess region may include a first surface of a (100) crystal plane and a second surface of one of {111} crystal planes. The method may further include performing a first selective epitaxial growth (SEG) process to form a base epitaxial pattern on the inner surface of the recess region at a process pressure in a range of about 50 Torr to about 300 Torr. The base epitaxial pattern may include a second semiconductor element different from the first semiconductor element. The method may also include performing a second selective epitaxial growth (SEG) process to form a bulk epitaxial pattern including the second semiconductor element on the base epitaxial pattern.

In various embodiments, a second semiconductor element concentration in the base epitaxial pattern may be less than a second semiconductor element concentration in the bulk epitaxial pattern. The base epitaxial pattern may have a first thickness on the first surface and a second thickness on the second surface, and a ratio of the second thickness to the first thickness of the base epitaxial pattern may be in a range about ¾ to about 1.

According to various embodiments, the substrate may include first dopants of a first conductivity type and the bulk epitaxial pattern may include second dopants of a second conductivity type different from the first conductivity type. The base epitaxial pattern may be free of the second dopants or a second dopant concentration in the base epitaxial pattern may be less than a second dopant concentration in the bulk epitaxial pattern.

In various embodiments, forming the recess region may include performing an anisotropic dry etching process to form a concave region in the substrate at a side of the gate pattern and performing an anisotropic wet etching process in the concave region to form the recess region. The anisotropic wet etching process may use {111} crystal planes of the substrate as etch stop surfaces.

In various embodiments, the method may further include performing an additional selective epitaxial growth (SEG) process to form a buffer epitaxial pattern including the second semiconductor element on the base epitaxial pattern before performing the second SEG process. A process pressure of the additional SEG process may be lower than the process pressure of the first SEG process.

According to various embodiments, a second semiconductor element concentration in the buffer epitaxial pattern may be less than a second semiconductor element concentration in the bulk epitaxial pattern and may be greater than a second semiconductor element concentration in the base epitaxial pattern.

A method of manufacturing an integrated circuit device may include forming a recess in a substrate including a first element. An inner surface of the recess may include a first surface of a (100) crystal plane and a second surface of one of {111} crystal planes. The method may further include forming a first epitaxial layer on the inner surface of the recess. The method may also include forming a second epitaxial layer in the recess on the first epitaxial layer. The first epitaxial layer may extend between the inner surface of the recess and the second epitaxial layer, and the second epitaxial layer may include a second element having a lattice size different from a lattice size of the first element.

In various embodiments, forming the first epitaxial layer may include performing an epitaxial growth process at a process pressure in a range of about 50 Torr to about 300 Torr.

According to various embodiments, the first epitaxial layer may include a portion of a first thickness on the first surface and a portion of a second thickness on the second surface, and a ratio of the second thickness to the first thickness may be in a range of about ¾ to about 1.

According to various embodiments, the method of claim may further include forming a gate structure on the substrate. A portion of the recess, whose inner surface may include the second surface, may be tapered toward a region under the gate structure.

In various embodiments, the first epitaxial layer may include the second element, and a second element concentration of the first epitaxial layer may be less than a second element concentration of the second epitaxial layer.

In various embodiments, the second epitaxial layer may include a first dopant of a first conductivity type, and a first dopant concentration of the second epitaxial layer may be greater than a first dopant concentration of the first epitaxial layer.

According to various embodiments, the first epitaxial layer may be free of the first dopant.

In various embodiments, the substrate may include a second dopant of a second conductivity type opposite to the first conductivity type.

According to various embodiments, the method of claim may further include forming a third epitaxial layer on the first epitaxial layer before forming the second epitaxial layer.

According to various embodiments, forming the first epitaxial layer may include performing a first epitaxial growth process at a first process pressure and forming the third epitaxial layer may include performing a second epitaxial growth process at a second process pressure less than the first process pressure.

In various embodiments, the first epitaxial layer may include a portion of a first thickness on the first surface and a portion of a second thickness on the second surface, and the third epitaxial layer may include a portion of a third thickness on the first surface and a portion of a fourth thickness on the second surface. A ratio of the second thickness to the first thickness may be greater than a ratio of the fourth thickness to the third thickness.

According to various embodiments, the first and third epitaxial layers may include the second element, and a second element concentration of the third epitaxial layer may be greater than a second element concentration of the first epitaxial layer and may be less than a second element concentration of the second epitaxial layer.

According to various embodiments, the second and third epitaxial layers may include a dopant of a first conductivity type and a dopant concentration of the second epitaxial layer may be greater than a dopant concentration of the third epitaxial layer.

In various embodiments, the first epitaxial layer may be free of the dopant or a dopant concentration of the first epitaxial layer may be less than the dopant concentration of the third epitaxial layer.

DETAILED DESCRIPTION

Figure 1A:
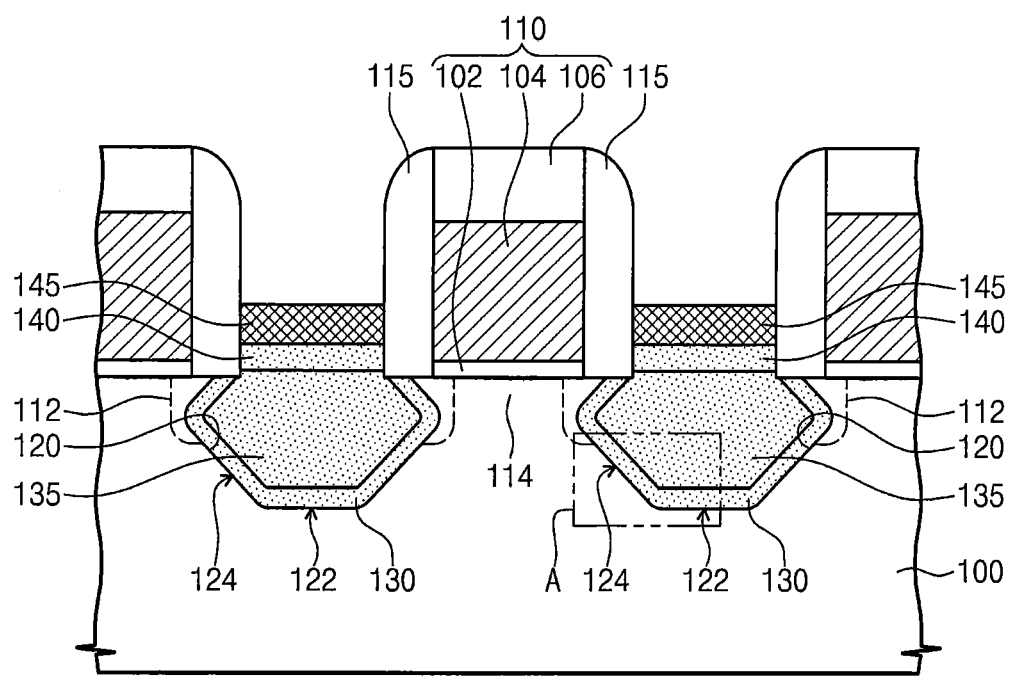
FIG. 1A is a cross-sectional view illustrating a semiconductor device according to some embodiments of the inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the inventive concepts are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, example embodiments of the inventive concepts should not be construed as limited to the particular shapes illustrated herein but include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, integers, steps, operations, elements, and/or components, but do not preclude the presence or addition of one or more other features, integers, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

Figure 1B:
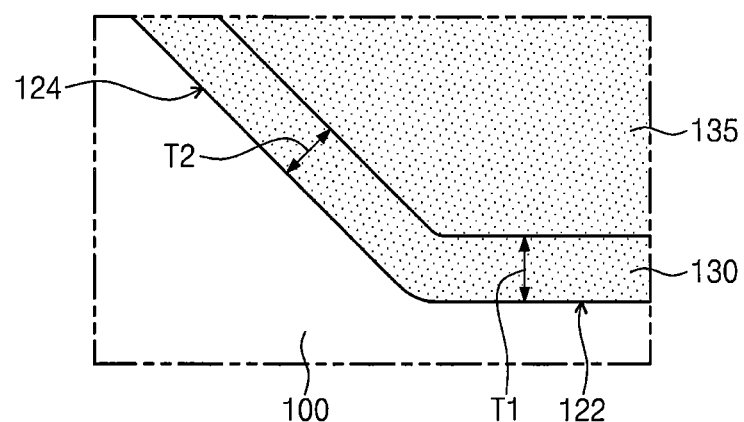
FIG. 1B is an enlarged view of a portion 'A' of FIG. 1A.

FIG. 1A is a cross-sectional view illustrating a semiconductor device according to some embodiments of the inventive concepts, and FIG. 1B is an enlarged view of a portion 'A' of FIG. 1A.

Referring to FIG. 1A, gate patterns 110 may be disposed on a substrate 100. The substrate 100 may include a first semiconductor element. For example, the substrate 100 may be formed of silicon. In other words, the first semiconductor element may be silicon. The substrate 100 may have a single-crystalline state. The substrate 100 may be doped with dopants of a first conductivity type. Each of the gate patterns 110 may include a gate insulating layer 102, a gate electrode 104, and a capping insulation pattern 106 which are sequentially stacked on the substrate 100. In some embodiments, the capping insulation pattern 106, the gate electrode 104, and the gate insulating layer 102 in the gate pattern 110 may have sidewalls aligned with each other, respectively. For example, the gate insulating layer 102 may include at least one of silicon oxide, silicon nitride, silicon oxynitride, and high-k dielectric (e.g., an insulating metal oxide such as aluminum oxide and/or hafnium oxide). The gate electrode 104 may include at least one of a doped semiconductor material (e.g., doped silicon), a metal (e.g., tungsten, titanium, and/or tantalum), a conductive metal nitride (e.g., titanium nitride, tantalum nitride, and/or tungsten nitride), and a metal-semiconductor compound (e.g., a metal silicide). The capping insulation pattern 106 may include silicon nitride and/or silicon oxynitride.

Gate spacers 115 may be disposed on both sidewalls of each of the gate patterns 110, respectively. For example, the gate spacer 115 may include silicon oxide, silicon nitride, and/or silicon oxynitride.

Recess regions 120 may be disposed in the substrate 100 adjacent to both sides of the gate pattern 110. An inner surface of each of the recess regions 120 may include a first surface 122 and a second surface 124. The first surface 122 is a (100) crystal plane of the substrate 100. The second surface 124 is one of {111} crystal planes of the substrate 100. The inner surface of each of the recess regions 120 may include a plurality of {111} crystal planes. As illustrated in FIG. 1A, each of the recess regions 120 may include an undercut region tapered toward a channel region 114 under the gate pattern 110. Ends of two {111} crystal planes may be in contact with each other to define the tapered undercut region.

A base epitaxial pattern 130 may be disposed on the inner surface of each of the recess regions 120. The base epitaxial pattern 130 may extend along the inner surface of the recess region 120. The base epitaxial pattern 130 may be in contact with the inner surface of the recess region 120. A bulk epitaxial pattern 135 may be disposed on the base epitaxial pattern 130 so as to fill the recess region 120. In some embodiments, the bulk epitaxial pattern 135 may be in contact with the base epitaxial pattern 130.

The base epitaxial pattern 130 and the bulk epitaxial pattern 135 include a second semiconductor element different from the first semiconductor element of the substrate 100. An atomic diameter of the second semiconductor element is different from an atomic diameter of the first semiconductor element. Thus, lattice sizes of the base and bulk epitaxial patterns 130 and 135 may be different from a lattice size of the substrate 100. As a result, the base and bulk epitaxial patterns 130 and 135 in the tapered undercut region may apply a specific force (e.g., a compressive force or a tensile force) to the channel region 114, such that mobility of charges may increase in the channel region 114.

Referring to FIGS. 1A and 1B, the base epitaxial pattern 130 has a first thickness T1 on the first surface 122 of the recess region 120 and a second thickness T2 on the second surface 124 of the recess region 120. A ratio of the second thickness T2 to the first thickness T1 may have a range of about 0.75:1 to about 1:1. In other words, the second thickness T2 may have a range of about 75% to about 100% of the first thickness T1. Thus, the base epitaxial pattern 130 may be substantially conformally disposed along the inner surface of the recess region 120. As a result, a volume of the bulk epitaxial pattern 135 filling the recess region 120 may be maximized. A concentration of the second semiconductor element of the bulk epitaxial pattern 135 is greater than a concentration of the second semiconductor element of the base epitaxial pattern 130. Thus, the specific force applied by the bulk epitaxial pattern 135 may increase, and the base epitaxial pattern 130 may relax stress caused by difference between the lattice sizes of the bulk epitaxial pattern 135 and the inner surface of the recess region 120.

As described above, the first surface 122 of the recess region 120 is the (100) crystal plane and the second surface 124 is one of the {111} crystal planes. Generally, a growth rate of an epitaxial layer on the (100) crystal plane may be greater than a growth rate of an epitaxial layer on the {111} crystal planes, such that an epitaxial layer on the (100) crystal plane may be thicker than an epitaxial layer on the {111} crystal planes. Thus, if the epitaxial layer on the {111} crystal planes is thick enough to relax the stress, the epitaxial layer on the (100) crystal plane may be thicker. Therefore, a volume of a bulk epitaxial layer may be reduced such that a specific force applied to a channel region 114 may be reduced.

However, according to some embodiments of the inventive concepts, it is possible to reduce or minimize difference between a growth rate of the base epitaxial pattern 130 on the second surface 124 and a growth rate of the base epitaxial pattern 130 on the first surface 122, so that the ratio of the second thickness T2 to the first thickness T1 of the base epitaxial pattern 130 has the range of about 0.75:1 to about 1:1. Thus, the base epitaxial pattern 130 may be substantially conformally formed on the inner surface of the recess region 120, and thus the volume of the bulk epitaxial pattern 135 may be increased or maximized. As a result, the specific force applied to the channel region 114 may be increased while the base epitaxial pattern 130 may relax the stress between the bulk epitaxial pattern 135 and the inner surface of the recess region 120. The base epitaxial pattern 130 may be formed by a selective epitaxial growth (SEG) process under a high process pressure in a range of about 50 Torr to about 300 Torr to reduce the difference between the growth rate of the base epitaxial pattern 130 on the second surface 124 and the growth rate of the base epitaxial pattern 130 on the first surface 122.

If a transistor including the channel region 114 and the gate pattern 110 is a PMOS transistor, the base and bulk epitaxial patterns 130 and 135 may apply the compressive force to the channel region 114. Thus, mobility of holes may be increased in a channel generated in the channel region 114. The atomic diameter of the second semiconductor element of the base and bulk epitaxial patterns 130 and 135 may be greater than the atomic diameter of the first semiconductor element of the substrate 100. For example, if the substrate is a silicon substrate, the base and bulk epitaxial patterns 130 and 135 may include silicon-germanium (SiGe). In this case, the second semiconductor element may be germanium (Ge).

Alternatively, if the transistor including the channel region 114 and the gate pattern 110 is a NMOS transistor, the base and bulk epitaxial patterns 130 and 135 may apply the tensile force to the channel region 114. Thus, mobility of electrons may be increased in the channel generated in the channel region 114. The atomic diameter of the second semiconductor element of the base and bulk epitaxial patterns 130 and 135 may be smaller than the atomic diameter of the first semiconductor element of the substrate 100. For example, if the substrate 100 is a silicon substrate, the base and bulk epitaxial patterns 130 and 135 may include silicon carbide (SiC). In this case, the second semiconductor element may be carbon (C).

The substrate 100 is doped with dopants of the first conductivity type, and the bulk epitaxial patterns 135 are doped with dopants of a second conductivity type different from the first conductivity type. The bulk epitaxial patterns 135 may correspond to source/drain regions of the transistor. One of the first and second conductivity types is an N-type and another of the first and second conductivity types is a P-type. The bulk epitaxial pattern 135 may be heavily doped.

The base epitaxial pattern 130 may have a dopant concentration less than a concentration of the dopants of the second conductivity type in the bulk epitaxial pattern 135. For example, the base epitaxial pattern 130 may be undoped. Alternatively, the base epitaxial pattern 130 may be doped with dopants of the second conductivity type and have a concentration of the dopants of the second conductivity type less than the concentration of the dopants of the second conductivity type in the bulk epitaxial pattern 135. Since the base epitaxial pattern 130 is undoped or has the low concentration of the dopants of the second conductivity type, a leakage current of the transistor may be reduced.

In an embodiment, a low concentration doped region 112 may be disposed in the substrate 100 between the channel region 114 and the base epitaxial pattern 130. The low concentration doped region 112 is doped with dopants of the second conductivity. A concentration of the dopants in the low concentration doped region 112 may be less than the concentration of the dopants in the bulk epitaxial pattern 135. Thus, the low concentration doped region and the bulk epitaxial pattern 135 may be realized as a Lightly Doped Drains (LDD) source/drain region or an extension source/drain.

A capping epitaxial pattern 140 may be disposed on each of the bulk epitaxial patterns 135. A top surface of the capping epitaxial pattern 140 may be higher than a top surface of the substrate 100. For example, the capping epitaxial pattern 140 may be formed of silicon. An ohmic pattern 145 may be disposed on the capping epitaxial pattern 140. For example, the ohmic pattern 145 may be formed of a metal-semiconductor compound (e.g., a metal silicide). For example, the ohmic pattern 145 may be formed by reaction between a metal and the capping epitaxial pattern 140. The ohmic pattern 145 may be formed of, for example, cobalt silicide, nickel silicide, and/or titanium silicide.

Next, modified examples of the semiconductor device according to some embodiments of the inventive concepts will be described with reference to the drawings. For the purpose of ease and convenience, the descriptions of the same components as in the above embodiment will be omitted or mentioned briefly.

Figure 2A:
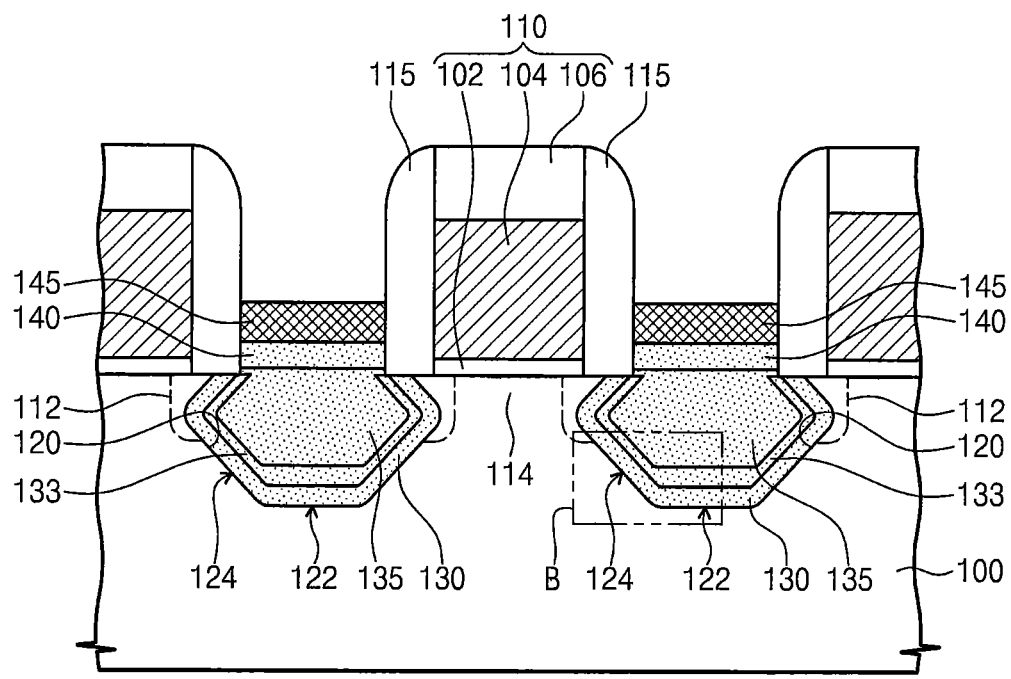
FIG. 2A is a cross-sectional view illustrating a semiconductor device according to some embodiments of the inventive concepts.
Figure 2B:
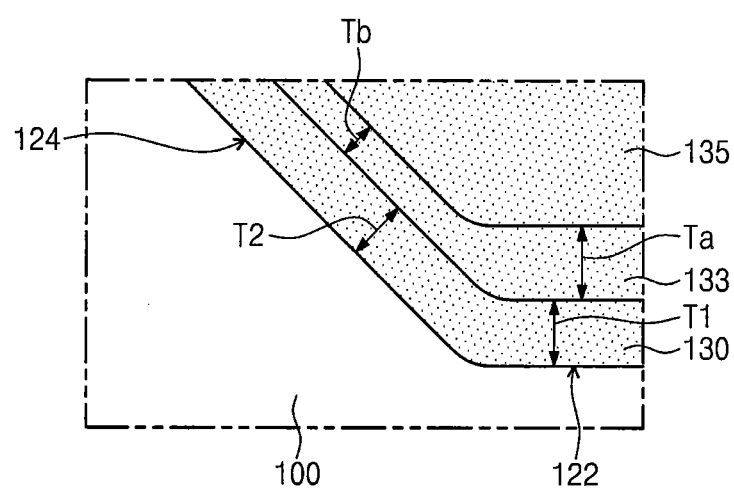
FIG. 2B is an enlarged view of a portion 'B' of FIG. 2A.

FIG. 2A is a cross-sectional view illustrating a semiconductor device according to some embodiments of the inventive concepts, and FIG. 2B is an enlarged view of a portion 'B' of FIG. 2A.

Referring to FIGS. 2A and 2B, a buffer epitaxial pattern 133 may be disposed between the base epitaxial pattern 130 and the bulk epitaxial pattern 135. The buffer epitaxial pattern 133 includes the second semiconductor element. For example, if the transistor is the PMOS transistor, the buffer epitaxial pattern 133 may include silicon-germanium (SiGe). If the transistor is the NMOS transistor, the buffer epitaxial pattern 133 may include silicon carbide (SiC).

A concentration of the second semiconductor element of the buffer epitaxial pattern 133 may be less than the concentration of the second semiconductor element of the bulk epitaxial pattern 135. In some embodiments, the concentration of the second semiconductor element of the buffer epitaxial pattern 133 may be greater than the concentration of the second semiconductor element of the base epitaxial pattern 130.

As illustrated in FIG. 2B, the buffer epitaxial pattern 133 may have a third thickness Ta on the first surface 122 of the recess region 120 and a fourth thickness Tb on the second surface 124 of the recess region 120. A ratio of the fourth thickness Tb to the third thickness Ta of the buffer epitaxial pattern 133 may be less than the ratio of the second thickness T2 to the first thickness T1 of the base epitaxial pattern 130. In other words, the ratio of the fourth thickness Tb to the third thickness Ta of the buffer epitaxial pattern 133 may be less than about 0.75:1.

Referring to FIGS. 2A and 2B, the buffer epitaxial pattern 133 may be doped with dopants of the second conductivity type. A concentration of the dopants of the buffer epitaxial pattern 133 may be less than the concentration of the dopants of the bulk epitaxial pattern 135. The dopant concentration of the base epitaxial pattern 133 may be equal to 0 (zero) and or may be less than the concentration of the dopants of the buffer epitaxial pattern 133.

Figure 3:
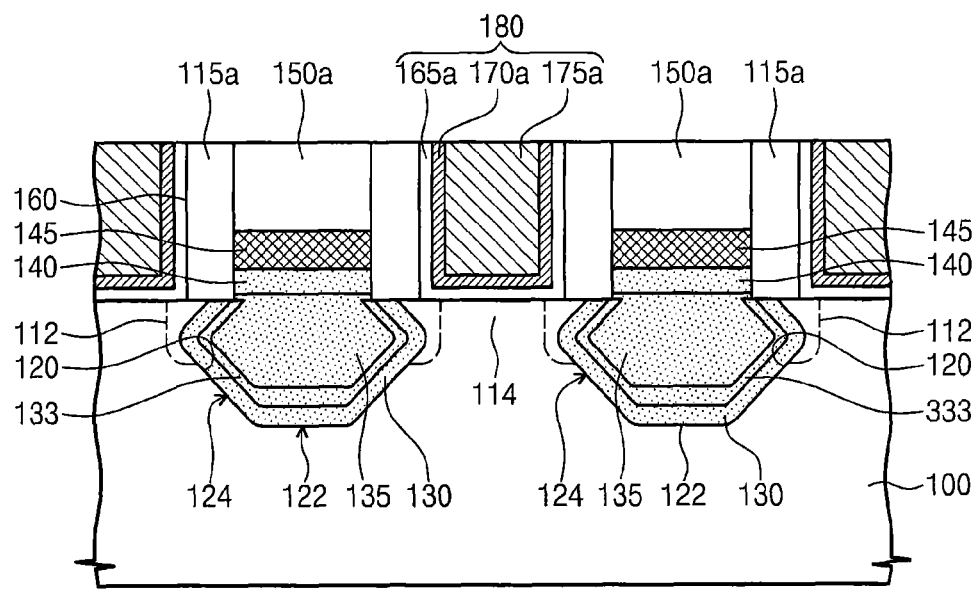
FIG. 3 is a cross-sectional view illustrating a semiconductor device according to some embodiments of the inventive concepts.

FIG. 3 is a cross-sectional view illustrating a semiconductor device according to some embodiments of the inventive concepts. In the present modified example, a gate pattern may have a structure different from that of the gate pattern 110 of FIGS. 1A and 2A.

Referring to FIG. 3, a gate pattern 180 may include a gate insulating pattern 165a and a gate electrode which are sequentially stacked on the substrate 100. In an embodiment, the gate electrode may include a barrier conductive pattern 170a and a metal pattern 175a which are sequentially stacked. Both ends of the barrier conductive pattern 170a may extend upward to cover both sidewalls of the metal pattern 175a, respectively. Both ends of the gate insulating pattern 165a may extend upward to cover both sidewalls of the gate electrode, respectively. Each of the extending portions of the barrier conductive pattern 170a may be disposed between the metal pattern 175 and each of the extending portions of the gate insulating pattern 165a.

A top surface of the gate pattern 180 may be substantially coplanar with top surfaces of gate spacers 115a and an interlayer insulating layer 150a which are disposed at both sides of the gate pattern 180. The interlayer insulating layer 150a may cover the ohmic pattern 145. The gate insulating pattern 165a may include at least one of silicon oxide, silicon nitride, silicon oxynitride, and a high-k dielectric (e.g., an insulating metal oxide such as hafnium oxide and/or aluminum oxide). The barrier conductive pattern 170a may include a conductive metal nitride (e.g., titanium nitride, tantalum nitride, and/or tungsten nitride). The metal pattern 175a may include tungsten and/or aluminum.

The gate pattern 180 according to the present modified example may be replaced with the gate pattern 110 of FIG. 1A.

The semiconductor devices according to some may be various kinds of semiconductor devices such as semiconductor memory devices, logic devices, and system on chips (SOCs).

FIGS. 4 to 9 are cross-sectional views illustrating a method of manufacturing a semiconductor device according to some embodiments of the inventive concepts.

Figure 4:
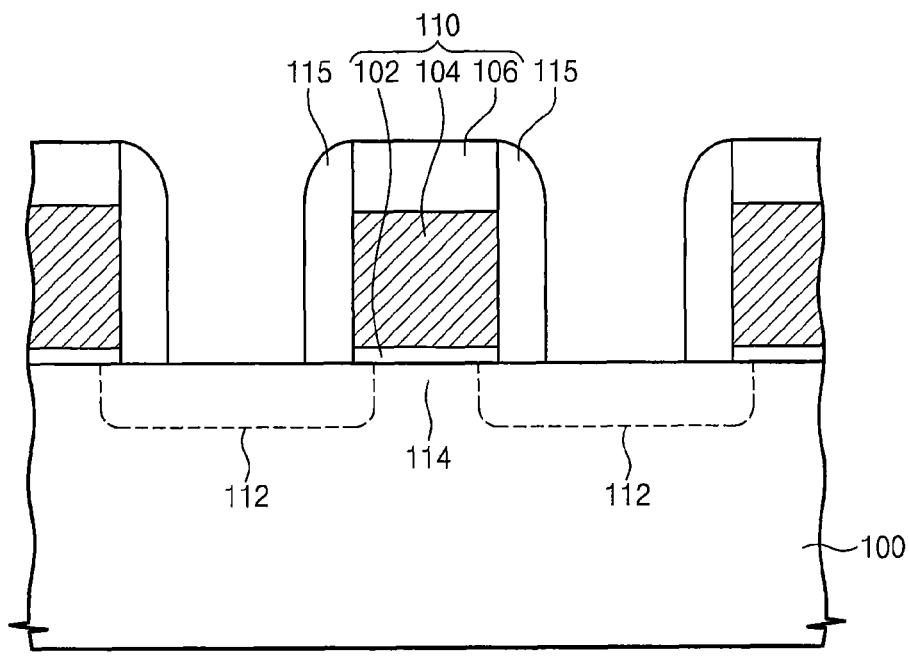
FIGS. 4 to 9 are cross-sectional views illustrating a method of manufacturing a semiconductor device according to some embodiments of the inventive concepts.

Referring to FIG. 4, gate patterns 110 may be formed on a substrate 100 which is formed of a first semiconductor element and is doped with dopants of a first conductivity type. Each of the gate patterns 110 may include a gate insulating layer 102, a gate electrode 104, and a capping insulating pattern 106 which are sequentially stacked on the substrate 100. Dopants of a second conductivity type may be implanted into the substrate 100 at both sides of the gate pattern 110, thereby forming low concentration doped regions 112. Gate spacers 115 may be formed on both sidewalls of each of the gate patterns 110, respectively.

Figure 5:
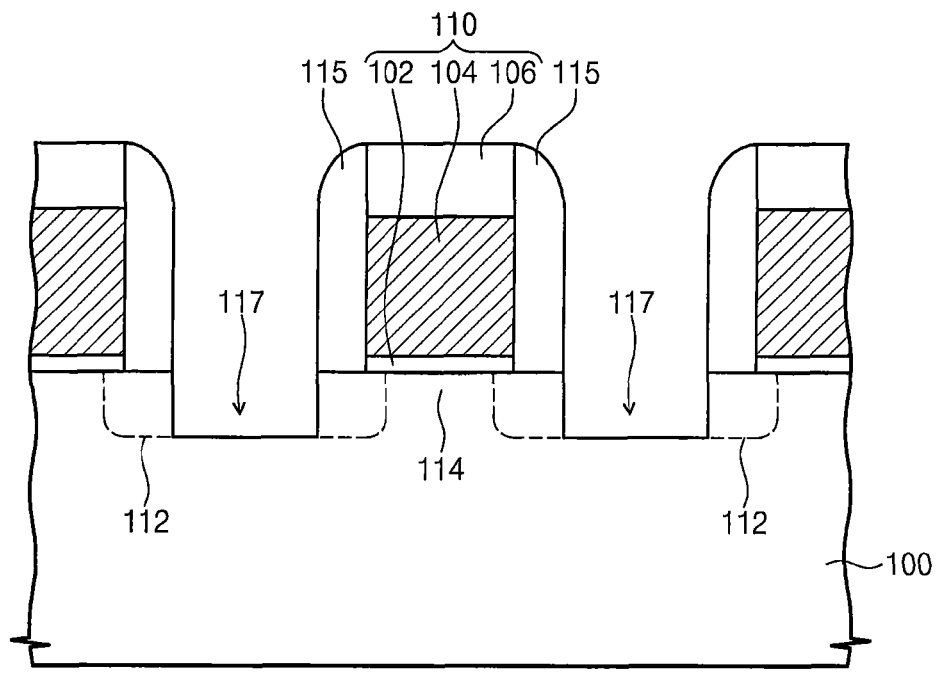

Referring to FIG. 5, an anisotropic dry etching process may be performed on the substrate 100 using the capping insulating patterns 106 and the gate spacers 155 as etch masks. Thus, concave regions 117 may be formed in the substrate 100 at both sides of each of the gate patterns 110.

Figure 6:
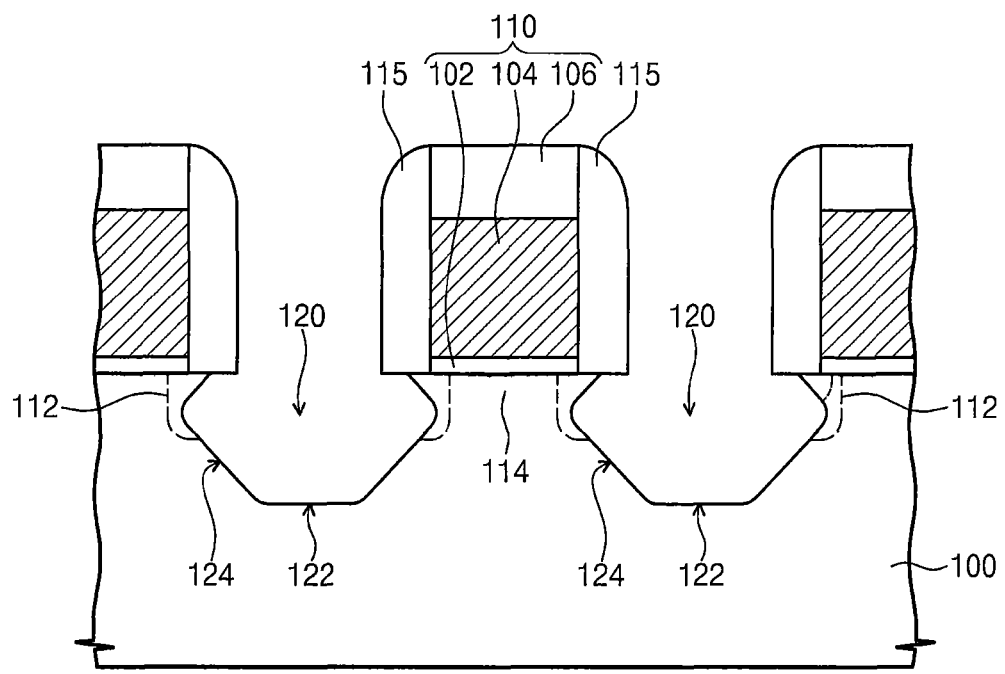

Referring to FIG. 6, an anisotropic wet etching process may be performed in concave regions 117 to form recess regions 120. The anisotropic wet etching process may use {111} crystal planes of crystal planes of the substrate 100 as etch stop surfaces. In other words, the anisotropic wet etching process may etch the {111} crystal planes very slowly compared with other crystal planes of the substrate 100. Sidewalls of the concave regions 117 may be laterally etched by the anisotropic wet etching process to form the recess regions 120 including tapered undercut regions under the gate pattern 110. The tapered undercut region may be laterally tapered toward a channel region 114 under the gate pattern 110. Due to the anisotropic wet etching process, an inner surface of the recess region 120 includes a first surface 122 of a (100) crystal plane and a second surface 124 of one of the {111} crystal planes. The first surface 122 may correspond to a bottom surface of the recess region 120.

In some embodiments, if the substrate 100 is a silicon substrate, the anisotropic wet etching process may include an anisotropic etchant including ammonium hydroxide (NH4OH) and/or tetramethyl ammonium hydroxide (TMAH).

Figure 7:
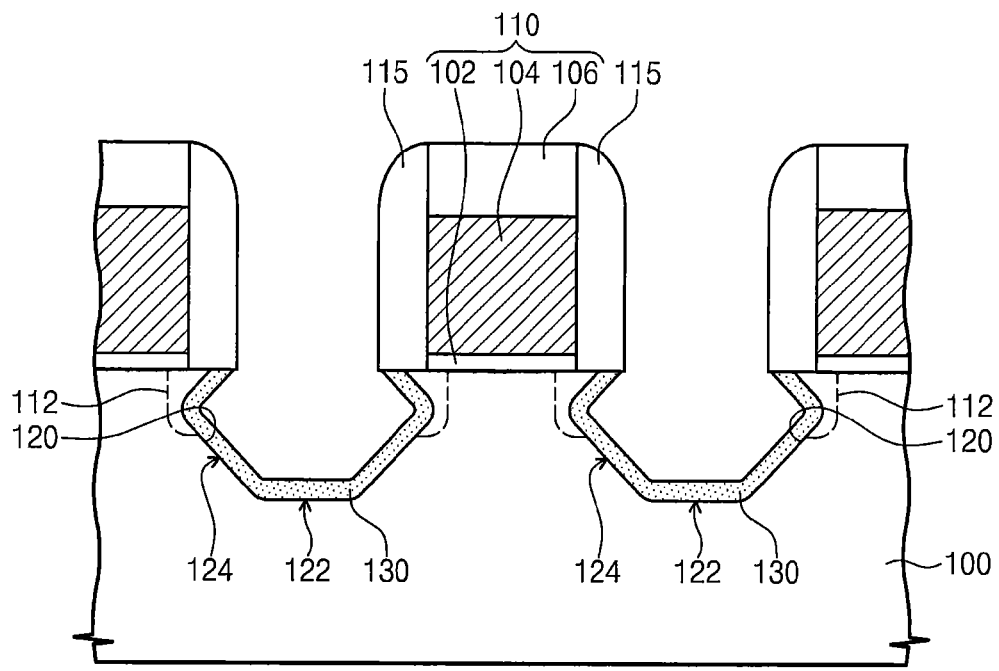

Referring to FIG. 7, a first selective epitaxial growth (SEG) process may be performed to form a base epitaxial pattern 130 on the inner surface of the recess region 120. The first SEG process may be performed under a high process pressure in a range of about 50 Torr to about 300 Torr. The first SEG process may use a process gas including a semiconductor source gas. The semiconductor source gas may include a second semiconductor element different from the first semiconductor element. Additionally, the semiconductor source gas may further include the first semiconductor element. For example, if a transistor including the gate pattern 110 is a PMOS transistor, the semiconductor source gas may include silicon and germanium. If the transistor is a NMOS transistor, the semiconductor source gas may include silicon and carbon.

Since the first SEG process is performed under the high process pressure, the semiconductor source gas may be sufficiently supplied to the second surface 124 (i.e., one of the {111} crystal planes) of the recess region 120. Thus, it is possible to reduce or minimize difference between a growth rate of the base epitaxial pattern 130 on the second surface 124 and a growth rate of the base epitaxial pattern 130 on the first surface 122. As a result, the base epitaxial pattern 130 may be substantially conformally formed on the inner surface of the recess region 120. In other words, a ratio of a thickness of the base epitaxial pattern 130 on the second surface 124 to a thickness of the base epitaxial pattern 130 on the first surface 122 may be in a range of about 0.75:1 to about 1:1.

The base epitaxial pattern 130 may be undoped. Alternatively, the base epitaxial pattern 130 may be lightly doped with dopants of a second conductivity type different from the first conductivity type. In this case, the base epitaxial pattern 130 may be doped in-situ. In other words, the process gas of the first SEG process may further include a dopant source gas having dopants of the second conductivity type.

Figure 8:
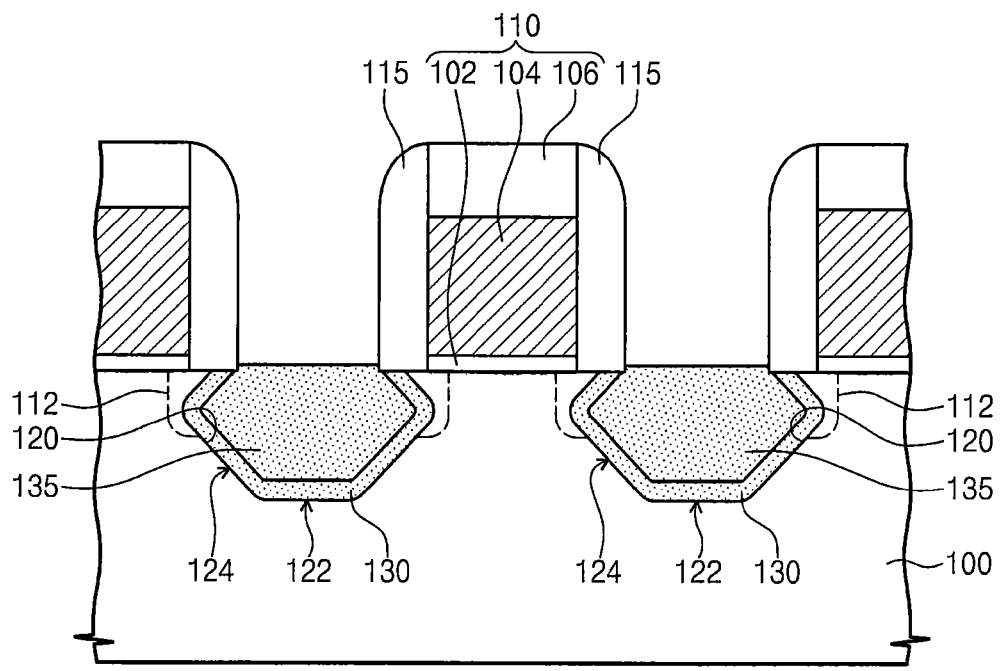

Referring to FIG. 8, a second selective epitaxial growth (SEG) process may be performed on the base epitaxial pattern 130 to form a bulk epitaxial pattern 135. The bulk epitaxial pattern 135 may fill the recess region 120 on the base epitaxial pattern 130. A process gas of the second SEG process includes a semiconductor source gas. The semiconductor source gas of the second SEG process includes the second semiconductor element. Additionally, the semiconductor source gas of the second SEG process may further include the first semiconductor element. For example, if the transistor is the PMOS transistor, the semiconductor source gas of the second SEG process may include silicon and germanium. If the transistor is the NMOS transistor, the semiconductor source gas of the second SEG process may include silicon and carbon.

The amount of the second semiconductor element in the semiconductor source gas of the second SEG process is greater than the amount of the second semiconductor element in the semiconductor source gas of the first SEG process. Thus, a concentration of the second semiconductor element in the bulk epitaxial pattern 135 may be greater than a concentration of the second semiconductor element in the base epitaxial pattern 130.

The bulk epitaxial pattern 135 is doped with dopants of the second conductivity type. The bulk epitaxial pattern 135 may be doped in-situ. For example, the process gas of the second SEG process may further include a dopant source gas having dopants of the second conductivity type. The bulk epitaxial pattern 135 may be heavily doped with the dopants of the second conductivity type. A process pressure of the second SEG process may be in a range of about 10 Torr to about 100 Torr. The first and second SEG processes may be sequentially performed in one process chamber.

Figure 9:
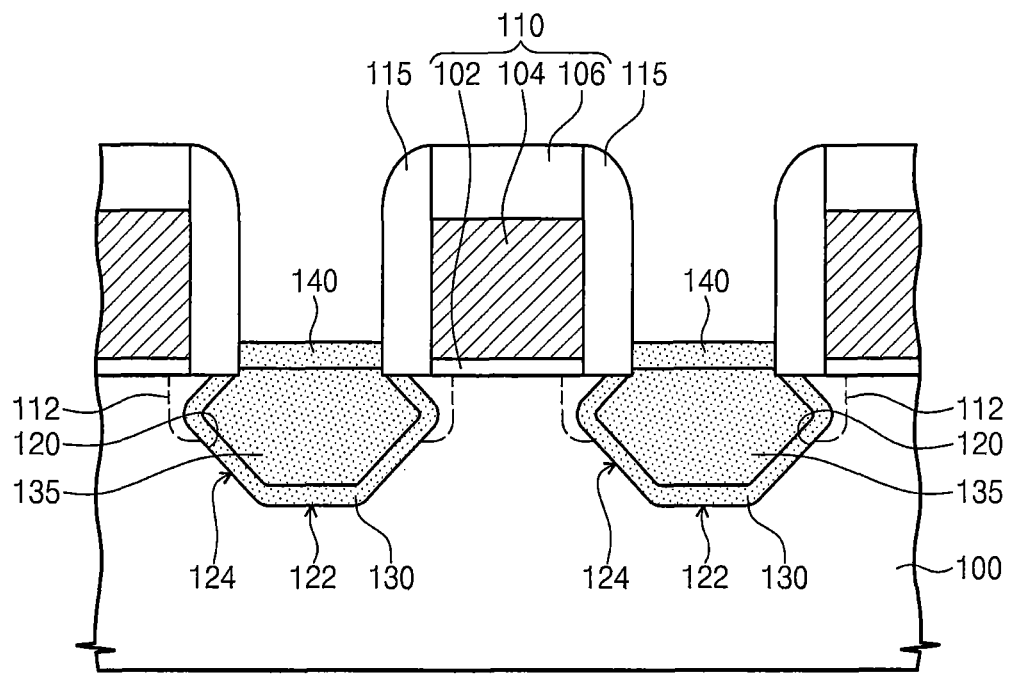

Referring to FIG. 9, a third selective epitaxial growth (SEG) process may be performed on the bulk epitaxial pattern 135 to form a capping epitaxial pattern 140. For example, the capping epitaxial pattern 140 may be formed of the first semiconductor element. For example, the capping epitaxial pattern 140 may be formed of silicon. The capping epitaxial pattern 140 may be doped with dopants of the second conductivity type. Subsequently, a metal layer may be formed on the substrate 100, and the metal layer may react with the capping epitaxial pattern 140, thereby forming the ohmic pattern 145 of FIG. 1A.

According to the method of manufacturing the semiconductor device described above, the base epitaxial pattern 130 is formed under the high process pressure. Thus, it is possible to reduce the difference between the growth rate of the base epitaxial pattern 130 on the second surface 124 and the growth rate of the base epitaxial pattern 130 on the first surface 122. As a result, the base epitaxial pattern 130 may be substantially conformally formed on the inner surface of the recess region 120.

Figure 10:
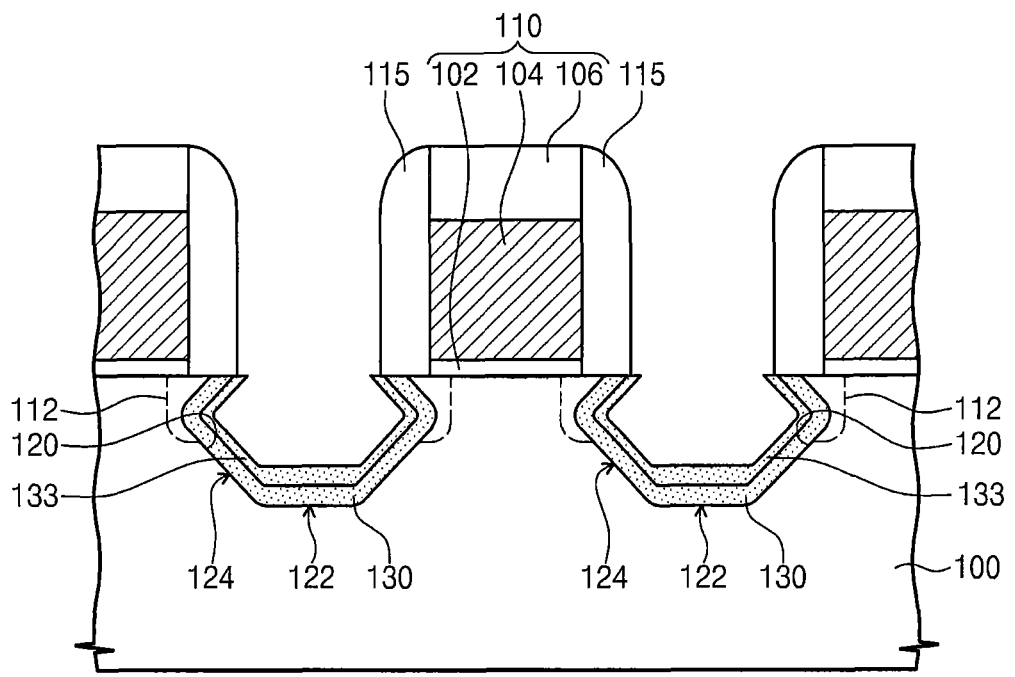
FIGS. 10 and 11 are cross-sectional views illustrating a modified example of a method of manufacturing a semiconductor device according to some embodiments of the inventive concepts.
Figure 11:
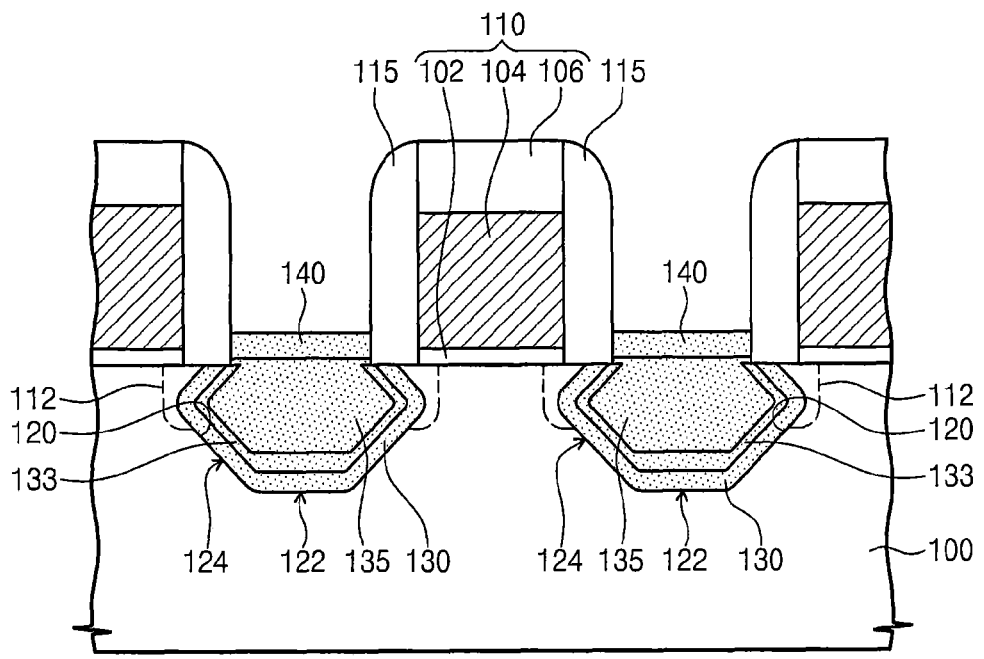

FIGS. 10 and 11 are cross-sectional views illustrating a method of manufacturing a semiconductor device according to some embodiments of the inventive concepts.

Referring to FIGS. 7 and 10, an additional selective epitaxial growth (SEG) process may be performed on the base epitaxial pattern 130 to form a buffer epitaxial pattern 133. A process pressure of the additional SEG process may be lower than the process pressure of the first SEG process. Thus, a ratio of a thickness of the buffer epitaxial pattern 133 on the second surface 124 to a thickness of the buffer epitaxial pattern 133 on the first surface 122 may be lower than the ratio of the thickness of the base epitaxial pattern 130 on the second surface 124 to the thickness of the base epitaxial pattern 130 on the first surface 122. For example, the process pressure of the additional SEG process may be in a range of about 10 Torr to 30 Torr.

A process gas of the additional SEG process may include the second semiconductor element. Additionally, the process gas of the additional SEG process may further include the first semiconductor element. The buffer epitaxial pattern 133 may be doped with dopants of the second conductivity type. For example, the buffer epitaxial pattern 133 may be doped in-situ. In this case, the process gas of the additional SEG process may further include a dopant source gas including dopants of the second conductivity type.

Referring to FIG. 11, the SEG process may be performed on the buffer epitaxial pattern 133 to form a bulk epitaxial pattern 135 on the buffer epitaxial pattern 133.

The amount of the second semiconductor element in the semiconductor source gas of the additional SEG process may be greater than the amount of the second semiconductor element in the semiconductor source gas of the first SEG process and less than the amount of the second semiconductor element in the semiconductor source of the second SEG process. Thus, a concentration of the second semiconductor element in the buffer epitaxial pattern 133 may be greater than the concentration of the second semiconductor element in the base epitaxial pattern 130 and less than the concentration of the second semiconductor element in the bulk epitaxial pattern 135.

The third SEG process described with reference to FIG. 9 may be performed to form the capping epitaxial pattern 140 and the ohmic pattern 145 of FIG. 2A may be formed on the capping epitaxial pattern 140.

FIGS. 12 to 17 are cross-sectional views illustrating a method of manufacturing a semiconductor device according to exemplary embodiments of the inventive concepts.

Figure 12:
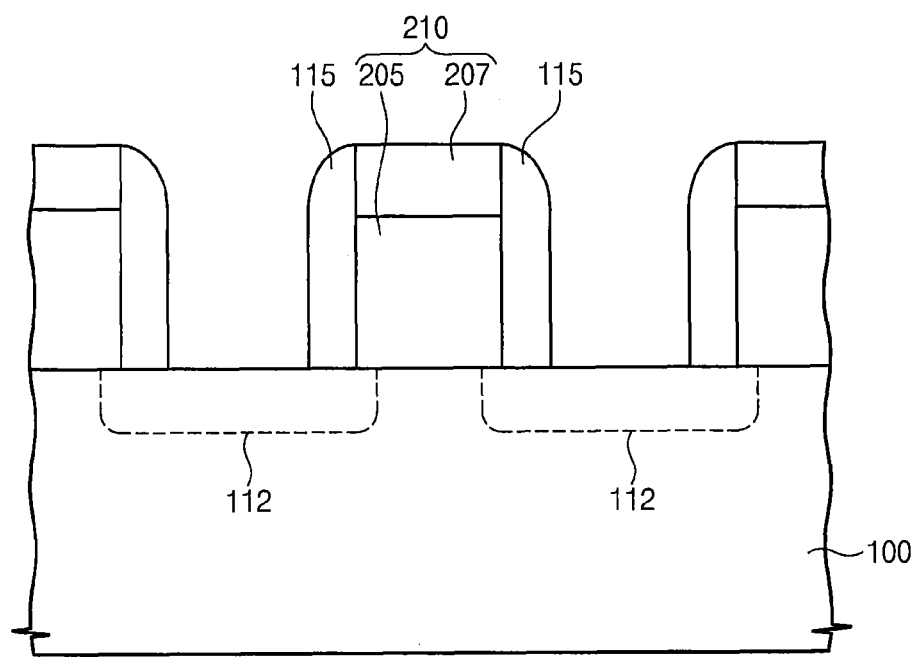
FIGS. 12 to 17 are cross-sectional views illustrating another modified example of a method of manufacturing a semiconductor device according to some embodiments of the inventive concepts.

Referring to FIG. 12, dummy gate patterns 210 may be formed on a substrate 100. Low concentration doped regions 112 may be formed in the substrate at both sides of each of the dummy gate patterns 210. Gate spacers 115 may be formed on both sidewalls of each of the dummy gate patterns 210, respectively. The dummy gate pattern 210 may include a material having an etch selectivity with respect to the gate spacer 115 and an interlayer insulating layer 150 formed through a subsequent process. In some embodiments, the dummy gate pattern 210 may include a lower pattern 205 and an upper pattern 207 which are sequentially stacked on the substrate 100. For example, if the gate spacer 115 is formed of silicon nitride and the interlayer insulating layer 150 is formed of silicon oxide, the lower pattern 205 may be formed of a semiconductor material (e.g., silicon) and the upper pattern 207 may be formed of silicon oxide. In some embodiments, a buffer oxide layer (not illustrated) may be formed between the dummy gate pattern 210 and the substrate 100.

Figure 13:
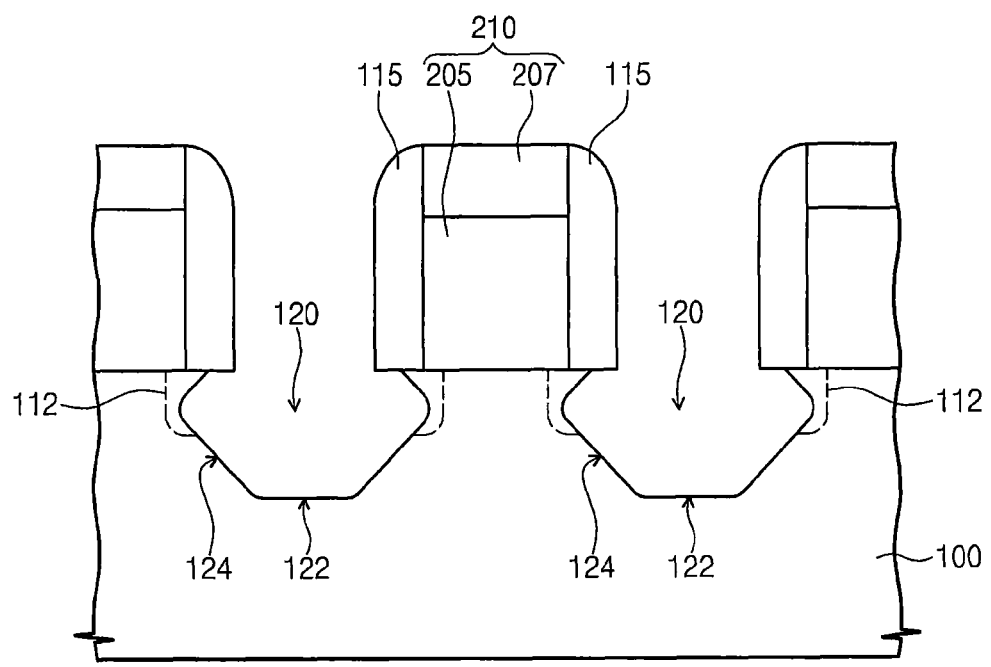

Referring to FIG. 13, the recess regions 120 may be formed in the substrate 100 at both sides of each of the dummy gate patterns 210, respectively. The recess regions 120 may be formed by the processes described with reference to FIGS. 5 and 6.

Figure 14:
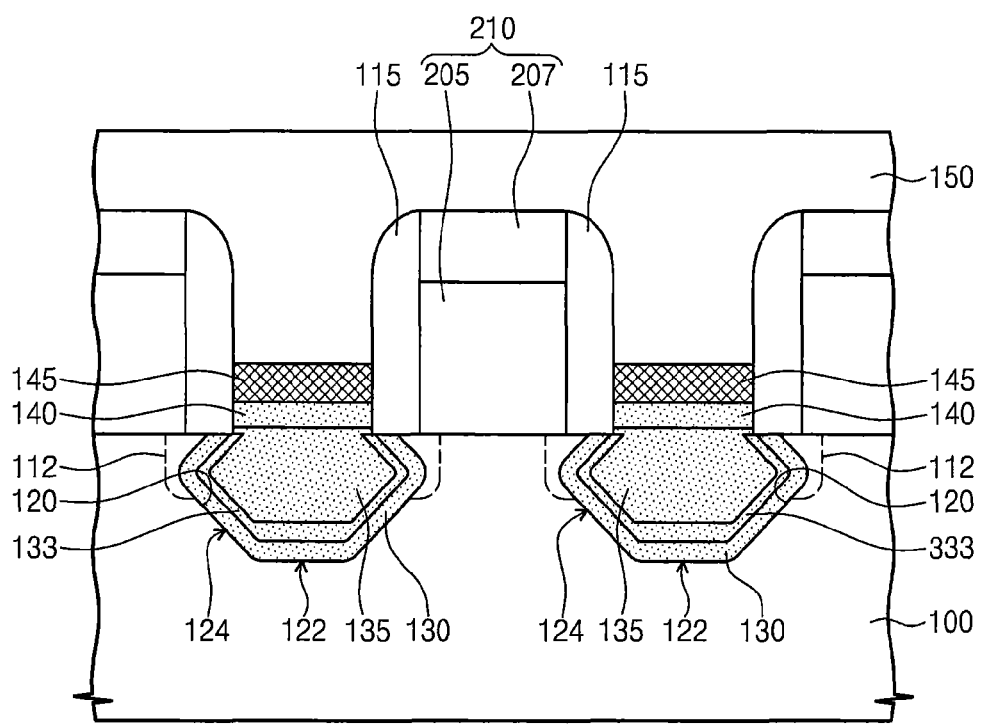

Referring to FIG. 14, the base, buffer, and bulk epitaxial patterns 130, 133, and 135 may be sequentially formed in each of the recess regions 120. In some embodiments, the formation of buffer epitaxial pattern 133 may be omitted. The capping epitaxial pattern 140 may be formed on the bulk epitaxial pattern 135, and the ohmic pattern 145 may be formed on the capping epitaxial pattern 140. The interlayer insulating layer 150 may be formed on an entire surface of the substrate 100.

Figure 15:
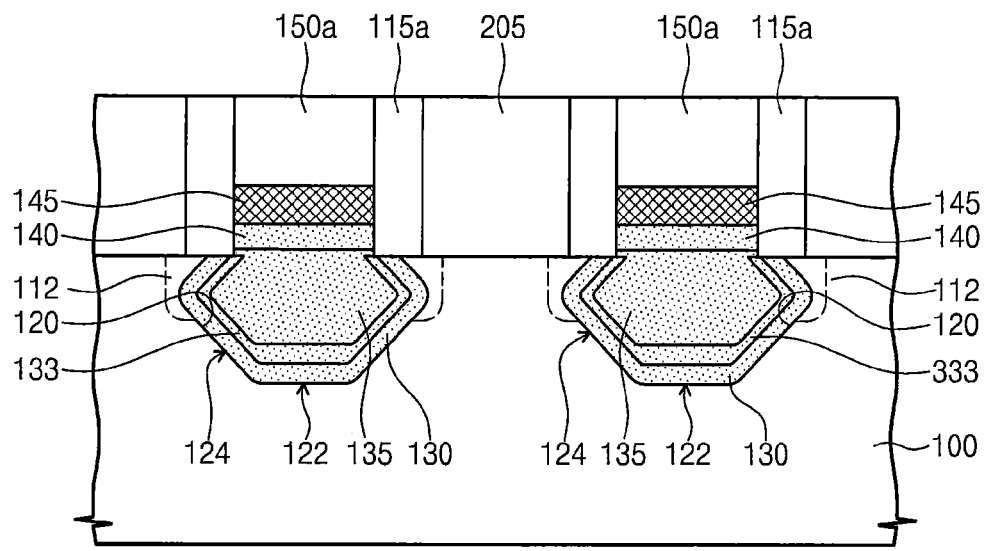

Referring to FIG. 15, the interlayer insulating layer 150 and the upper pattern 207 of the dummy gate pattern 210 may be planarized until the lower pattern 205 is exposed. Upper portions of the gate spacers 115 may also be planarized by the planarizing process. As mentioned above, the lower pattern 205 of the dummy gate pattern 210 may have the etch selectivity with respect to the planarized interlayer insulating layer 150a and the planarized gate spacers 115a.

Figure 16:
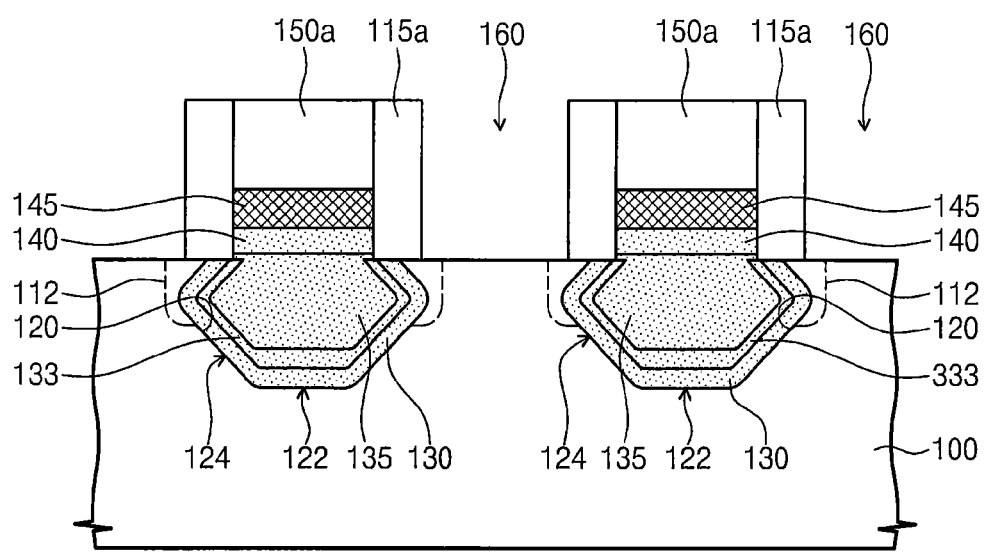

Referring to FIG. 16, the exposed lower patterns 205 may be removed to form openings 160. If the buffer oxide layer is formed, the buffer oxide layer may be removed to expose the substrate 100 under the openings 160 after the removal of the lower patterns 205.

Figure 17:
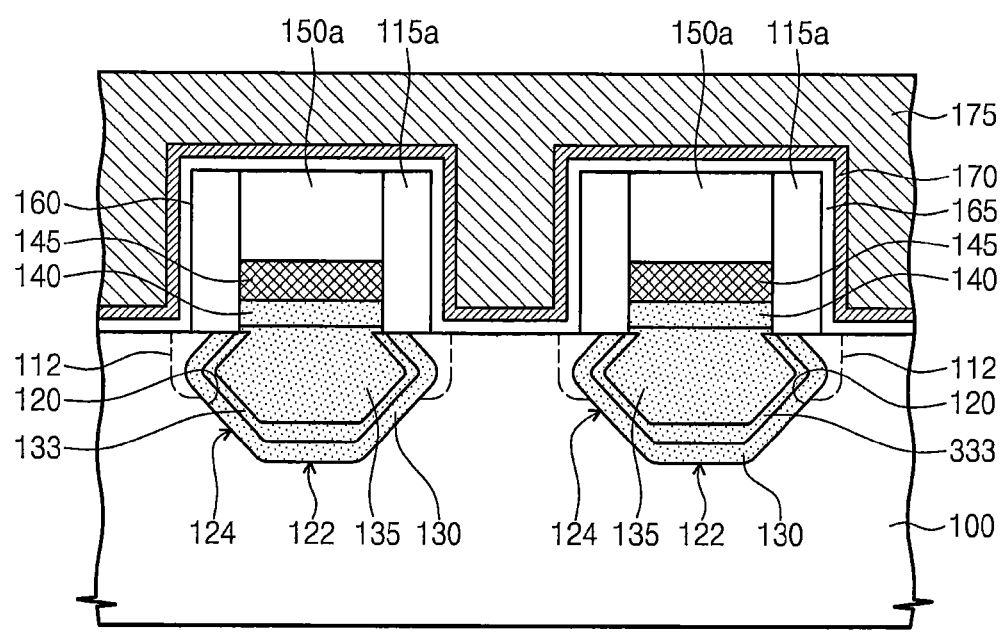

Referring to FIG. 17, a gate insulating layer 165 and a gate conductive layer may be sequentially formed on the substrate 100 having the openings 160. In some embodiments, the gate conductive layer may include a barrier conductive layer 170 and a metal layer 175 which are sequentially stacked. The gate insulating layer 165 may be formed by a chemical vapor deposition (CVD) process or an atomic layer deposition (ALD) process. Thus, the gate insulating layer 165 may be substantially conformally formed on the substrate 100. Alternatively, the gate insulating layer 165 may be formed by an oxidation process and/or a nitridation process. In this case, the gate insulating layer 165 may be selectively formed on the substrate 100 exposed by each of the openings 160.

The metal layer 175, the barrier conductive layer 170, and the gate insulating layer 165 may be planarized until the planarized interlayer insulating layer 150a is exposed. Thus, the gate patterns 180 of FIG. 3 may be formed. As described above, the gate pattern 180 may include the gate insulating pattern 165a, the barrier conductive pattern 170a, and the metal pattern 175a.

The semiconductor devices described above may be encapsulated using various packaging techniques. For example, the semiconductor devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

The package in which the semiconductor device according to some embodiments is mounted may further include at least one semiconductor device (e.g., a controller and/or a logic device) that controls the semiconductor memory device.

Figure 18:
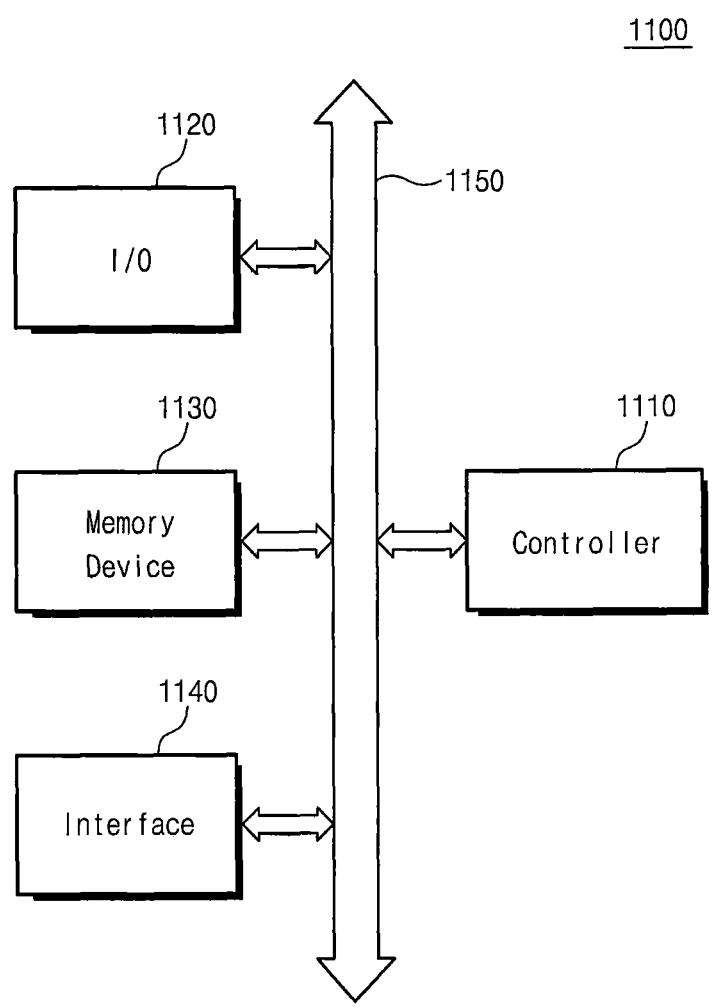
FIG. 18 is a block diagram illustrating an example of electronic systems including semiconductor devices according to some embodiments of the inventive concepts.

FIG. 18 is a block diagram illustrating an example of electronic systems including semiconductor devices according to some embodiments of the inventive concepts.

Referring to FIG. 18, an electronic system 1100 according to an embodiment may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard and/or a display unit. The memory device 1130 may store data and/or commands. The memory device 1130 and/or the controller 1110 may include at least one of the semiconductor devices according to some embodiments described above.

The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. The electronic system 1100 may further include a fast DRAM device and/or a fast SRAM device which acts as a cache memory for improving an operation of the controller 1110.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless.

Figure 19:
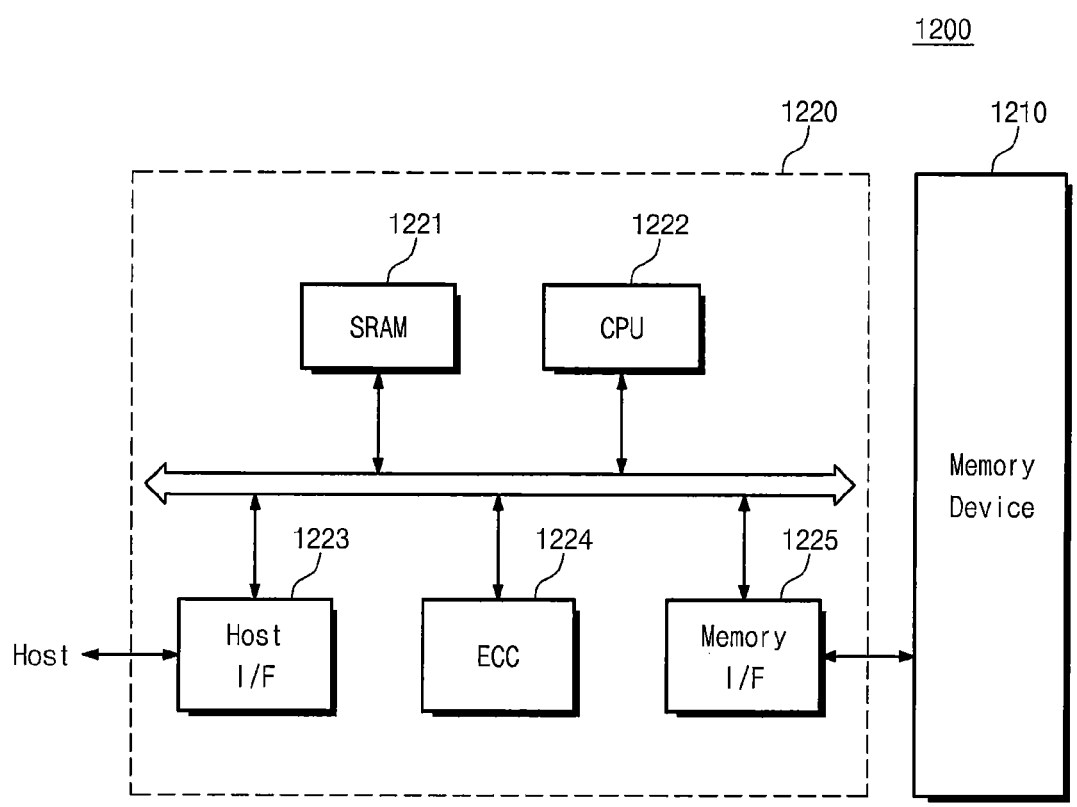
FIG. 19 is a block diagram illustrating an example of memory cards including semiconductor devices according to some embodiments of the inventive concepts.

FIG. 19 is a block diagram illustrating an example of memory cards including semiconductor devices according to some embodiments of the inventive concepts.

Referring to FIG. 19, a memory card 1200 according to an embodiment of the inventive concepts may include a memory device 1210. The semiconductor devices according to the aforementioned embodiments comprise semiconductor memory devices, the memory device 1210 may include at least one of the semiconductor devices according to some embodiments mentioned above. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 as an operation memory of the CPU 1222.

Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. The memory card 1200 may further include a read only memory (ROM) device that stores code data to interface with the host. The memory card 1200 may be used as a portable data storage card. Alternatively, the memory card 1200 may be solid state disks (SSD) which are used as hard disks of computer systems.

According to various embodiments of the inventive concepts as described above, the ratio of the second thickness to the first thickness of the base epitaxial pattern may have the range of about 0.75:1 to about 1:1. Thus, the base epitaxial pattern may be substantially conformally formed on the inner surface of the recess region. As a result, the volume of the bulk epitaxial pattern may increase in the recess region, such that the specific force (e.g., the compressive force or the tensile force) may be sufficiently applied to the channel region under the gate pattern.

The first SEG process for the formation of the base epitaxial pattern may be performed under the high process pressure of about 50 Torr to about 300 Torr. Thus, the semiconductor source gas may be sufficiently supplied to the {111} crystal planes of the inner surface of the recess region. As a result, it is possible to improve uniformity of the thickness of the base epitaxial pattern.

The above-disclosed subject matter is to be considered illustrative, and not restrictive, and the appended claims are intended to cover all such modifications, enhancements, and other embodiments, which fall within the true spirit and scope of the inventive concepts. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
    a substrate comprising a first semiconductor element;
    a gate pattern on the substrate;
    a base epitaxial pattern on an inner surface of a recess region in the substrate at a side of the gate pattern, the inner surface of the recess region including a first surface defining a bottom surface of the recess region and a second surface defining a sidewall surface of the recess region, and the base epitaxial pattern comprising a second semiconductor element different from the first semiconductor element;
    a bulk epitaxial pattern on the base epitaxial pattern, the bulk epitaxial pattern comprising the second semiconductor element; and
    a buffer epitaxial pattern between the base epitaxial pattern and the bulk epitaxial pattern, the buffer epitaxial pattern comprising the second semiconductor element,
    wherein the base epitaxial pattern has a first thickness on the first surface and a second thickness on the second surface, wherein the buffer epitaxial pattern has a third thickness on the first surface and a fourth thickness on the second surface, and wherein a ratio of the fourth thickness to the third thickness of the buffer epitaxial pattern is less than a ratio of the second thickness to the first thickness of the base epitaxial pattern.

2. The semiconductor device of claim 1, wherein the first surface is a (100) crystal plane, and wherein the second surface is one of {111} crystal planes.

3. The semiconductor device of claim 2, wherein the ratio of the second thickness to the first thickness of the base epitaxial pattern is in a range of about ¾ to about 1.

4. The semiconductor device of claim 1, wherein the substrate comprises first dopants of a first conductivity type and the bulk epitaxial pattern comprises second dopants of a second conductivity type that is different from the first conductivity, and wherein the base epitaxial pattern is free of the second dopants.

5. The semiconductor device of claim 1, wherein the base epitaxial pattern is formed at a process pressure in a range of about 50 Torr to about 300 Torr.

6. The semiconductor device of claim 1, wherein the recess region comprises an undercut region tapered toward a region under the gate pattern.

7. The semiconductor device of claim 1, wherein a second semiconductor element concentration in the buffer epitaxial pattern is less than a second semiconductor element concentration in the bulk epitaxial pattern and is greater than a second semiconductor element concentration in the base epitaxial pattern.

8. The semiconductor device of claim 7, wherein the substrate comprises first dopants of a first conductivity type, the bulk epitaxial pattern and the buffer epitaxial pattern comprise second dopants of a second conductivity type different from the first conductivity type, wherein a second dopant concentration in the buffer epitaxial pattern is less than a second dopant concentration in the bulk epitaxial pattern, and wherein the base epitaxial pattern is free of the second dopants or a second dopant concentration in the base epitaxial pattern is less than the second dopant concentration in the buffer epitaxial pattern.

* * * * *